(12) United States Patent
Steckel

(10) Patent No.: US 7,370,312 B1
(45) Date of Patent: May 6, 2008

(54) SYSTEM AND METHOD FOR CONTROLLING SIMULATION OF HARDWARE IN A HARDWARE DEVELOPMENT PROCESS

(75) Inventor: Geoffrey W. E. Steckel, Newton, MA (US)

(73) Assignee: Bluespec, Inc., Waltham, MA (US)

( * ) Notice: Subject to any disclaimer, the term of this patent is extended or adjusted under 35 U.S.C. 154(b) by 213 days.

(21) Appl. No.: 11/047,281

(22) Filed: Jan. 31, 2005

(51) Int. Cl.
*G06F 17/50* (2006.01)

(52) U.S. Cl. .................. 716/18; 716/1; 716/2; 716/6

(58) Field of Classification Search ............ 716/1, 716/2, 6, 18
See application file for complete search history.

(56) References Cited

U.S. PATENT DOCUMENTS

| | | | |
|---|---|---|---|
| 5,005,136 | A | 4/1991 | Van Berkel et al. |
| 5,530,863 | A | 6/1996 | Hino |
| 5,696,942 | A | 12/1997 | Palnitkar et al. |
| 5,862,361 | A | 1/1999 | Jain |
| 6,263,303 | B1 | 7/2001 | Yu et al. |
| 6,584,597 | B1 | 6/2003 | Kishinevsky et al. |
| 6,597,664 | B1 | 7/2003 | Mithal et al. |
| 2003/0131324 | A1 | 7/2003 | Takenaka |
| 2004/0052215 | A1 | 3/2004 | Mithal et al. |

FOREIGN PATENT DOCUMENTS

| | | |
|---|---|---|
| EP | 0 329 233 A2 | 8/1989 |
| EP | 0 829 812 A2 | 3/1998 |
| WO | WO-01/13285 * | 2/2001 |
| WO | WO 01/13285 A2 | 2/2001 |

OTHER PUBLICATIONS

Arvind, et al., High-level Synthesis: An Essential Ingredient for Designing Complex ASICs.
Poyneer, et al., "A TRS Model for a Modern Microprocessor: Computation Structures Group Memo 408", Laboratory for Computer Science, MIT, Jun. 25, 1998.
Liao, et al., "An Efficient Implementation of Reactivity for Modeling Hardware in the Scenic Design Environment", ACM, Inc., 1997.
Shen, et al., "Design and Verification of Speculative Processors", Computation Structures Group Memo 400 (B), Laboratory for Computer Science, MIT, Jun. 1998.
Rosenband, et al., "Flexible and Scalable Hardware Synthesis from Guarded Atomic Actions", MIT Computer Science and Artificial Intelligence Laboratory, 2004.

(Continued)

*Primary Examiner*—Thuan Do
(74) *Attorney, Agent, or Firm*—William A. Loginov; Loginov & Associates, PLLC

(57) ABSTRACT

A system and method for simulating a digital circuit uses scheduling information for Term Rewriting System (TRS) rules to limit the computation of simulation values to only those value used by the rules scheduled to execute on the current state of the system. Typically only a small subset of TRS rules are scheduled to execute on any given state, thus only values related to this subset are computed. Such a determination may be made by leveraging the logical separation of rule activations and rule actions in a TRS system, such that only rule activation information need be examined.

13 Claims, 7 Drawing Sheets

OTHER PUBLICATIONS

Hoe, et al., "Hardware Synthesis from Term Rewriting Systems", Computation Structures Group Memo 421A, Laboratory for Computer Science, MIT, Aug. 20, 1999.

Matthews, et al., "Microprocessor Specification in Hawk", IEEE, 1998.

Shen, et al., "Modeling and Verification of ISA Implementations", Computation Structures Group Memo 400 (A), Laboratory for Computer Science, MIT, Jun. 20, 1997.

Babb, et al., "Parallelizing Applications into Silicon".

Windley, P., "Specifying Instruction-Set Architectures in HOL: A Primer".

Hoe, et al., "Synthesis of Operation-Centric Hardware Descriptions", Computation Structures Group Memo 426A, Laboratory for Computer Science, MIT, Jul. 29, 2000.

Arvind, et al., "Computer Architecture Modeling, Synthesis, and Verification", Laboratory for Computer Science, MIT, Mar. 2003.

Arvind, et al., "Using Term Rewriting Systems to Design and Verify Processors", Computation Structures Group Memo 419, Laboratory for Computer Science, MIT, Nov. 1998.

Bluespec, Inc., Bluespec™ SystemVerilog, Version 3.8, Reference Guide, Preliminary Draft, Sep. 2, 2004, (included by reference in specification, not considered admitted prior art).

Ayala-Rincon, et al., "Architectural Specification, Exploration and Simulation Through Rewriting-Logic".

Murali Bharathala, "Cycle Simulation", VHDL Times, http://cs.haifa.ac.il/courses/Verification_Seminar/sim_verification/Cycle%20SIm%20VHDL%20International%20&5bVI%5d%20-%20VHDL%20Times.htm.

Maxfield, C., "Digital Logic Simulation: Event-driven, Cycle-based, and Home brewed", EDN Access, http://www.edn.com/achives/1996/010496/14df4.htm.

Laramee, T., "Tutorial on Event Driven Simulations of Network Protocols", Event Driven Simulation Tutorial, http://www-unix.ecs.umass.edu/~ece671/simulation/.

John, L. K., "Performance Evaluation: Techniques, Tools and Benchmarks", Electrical and Computer Engineering Department, University of Texas at Austin.

Palnitkar, S., "Verilog HDL: A Guide to Digital Design and Synthesis", Second Edition, 2003, pp. 341-360, 421-424, Sun Microsystems Press.

Weste, et al., "CMOS VLSI Design: A Circuits and Systems Perspective", Third Edition, 2004, pp. 273-317.

Hoe, et al., "Hardware Synthesis from Term Rewriting Systems," In the Proceedings of X IFIP International Conference on VLSI (VLSI '99), Massachusetts Institute of Technology, Computer Science and Artificial Intelligence Laboratory, Computation Structures Group, Memo 421A, Aug. 20, 1999.

Hoe, James C., "Operation-Centric Hardware Description and Synthesis", IEEE Transactions on Computer-Aided Design of Integrated Circuits and Systems, vol. 23, No. 9, Sep. 2004, pp. 1277-1288.

Hoe, James C., "Operation-Centric Hardware Discription and Synthesis," Massachusetts Institute of Technology, Apr. 28, 2000.

Wunderlich, Roland E., et al., "In-System FPGA Prototyping of an Itanium Microarchitecture," Proceedings of the 22nd International Conference on Computer Design (ICCD 2004), Oct. 2004.

Arvind, et al., "Bluespec: Why Chip Design Can't be Left EE's," University of California, Irvine, Mar. 22, 2004.

Nordin, Grace, et al., "Synchronous Extensions to Operation-Centric Hardware Description Languages," IEEE, 2004.

Rosenband, et al., "Modular Scheduling of Atomic Actions," Massachusetts Institute of Technology, Computer Science and Artificial Intelligence Laboratory, Computation Structures Group, Memo 463, Jun. 4, 2004.

Rosenband, et al., "Modular Scheduling of Guarded Atomic Actions,"In the Proceedings of the 41st Design Automation Conference (DAC), San Diego, CA, Massachusetts Institute of Technology, Computer Science and Artificial Intelligence Laboratory, Computation Structures Group, Memo 468, Jun. 2004.

Dave, Nirav "Designing a Reorder Buffer in Bluespec," In Proceedings of Formal Methods and Models for Codesign (MEMOCODE '2004), San Diego, California, Massachusetts Institute of Technology, Computer Science and Artificial Intelligence Laboratory, Computation Structures Group, Memo 478, Jun. 2004.

Rosenband, et al., "The Ephemeral History Register: Flexible Scheduling for Rule-Based Designs," In the Proceedings of Formal Methods and Models for Codesign (MEMOCODE '2004), San Diego, California, Massachusetts Institute of Technology, Computer Science and Artificial Intelligence Laboratory, Computation Structures Group, Memo 479, Jun. 22-25, 2004.

Dave, Nirav H., "Desiging a Processor in Bluespec," Department of Electrical Engineering and Computer Science, Massachusetts Institute of Technology, Jan. 2005.

Nikhil, R., "Future Programming of FPGAs", Bluespec, Inc., Feb. 23, 2004.

* cited by examiner

SYSTEM AND METHOD FOR CONTROLLING SIMULATION OF HARDWARE IN A HARDWARE DEVELOPMENT PROCESS

CROSS-REFERENCE TO RELATED APPLICATION

The present invention is related to the following co-pending and commonly assigned U.S. patent application Ser. No. 11/047,329 titled, *System and Method for Scheduling TRS Rules*, which application is hereby incorporated by reference as though fully set forth herein.

BACKGROUND OF THE INVENTION

1. Field of the Invention

This invention relates generally to the verification and simulation of digital circuits developed in a hardware design process, and more specifically to the use Term Rewriting System (TRS) rules in the simulation of synchronous digital circuits.

2. Background Information

Hardware Description Languages (HDLs) have been used for many years to design digital systems. Such languages employ text-based expressions to describe electronic circuits, enabling designers to design much larger and more complex systems than possible using previously known gate-level design methods. With HDLs, designers are able to use various constructs to fully describe hardware components and the interconnections between hardware components. Two popular Hardware Description Languages are Verilog, first implemented by Phil Moorby of Gateway Design Automation in 1984, and later standardized under IEEE Std. 1364 in 1995, and VHDL (Very High Speed Integrated Circuit (VHSIC) Hardware Design Language), standardized in IEEE Std. 1076. Both, these languages, and other similar languages, have been widely used to design hardware circuits.

As the complexity of digital circuits has increased, conventional HDLs such as Verilog and VHDL have increasingly shown their limitations. New HDLs based on Term Rewriting System (TRS) technology address some of the limitations of the conventional methods. A TRS employs a list of "terms" that describe hardware states, and a list of "rules" that describe hardware behavior. A "rule" captures both a state-change (an action) and the conditions under which the action can occur. Further, each rule has atomic semantics—that is, each rule executes fully without interactions with other rules. This implies that, even if multiple rules are executed on a given state, they can be considered in isolation for analysis and debugging purposes.

More formally, a Term Rewriting System has rules that consist of a predicate (a function that is logical true or false) and an action body (a description of a state transition). A rule may be written in the following form:

$$\text{rule } r\text{: when } \pi(s) \Rightarrow s := \delta(s)$$

where s is the state of the system, $\pi$ is the predicate, and $\delta$ is a function used to compute the next state of the system. In a strict implementation of a TRS, only one rule may execute on a given state. However, as explained further below, concurrent application of rules is desirable for efficient execution. Therefore, if several rules are applicable on a given state, some implementations may allow more than one rule to be selected to update the system. Afterwards, all rules are re-evaluated for applicability on the new state of the system and the process continues until no further rules are applicable.

While a TRS approach has been advantageously employed in the design of digital circuits, improvement in the verification (the proving or disproving of the correctness) of these digital circuits has lagged. As the complexity of digital circuits increases, verification consumes an increasingly large portion of the development process' time and resources, now often consuming as much as sixty or seventy percent of development time for a reasonably complex circuit. The development of a digital circuit typically follows an iterative flow, including a variety of stages of design and verification, such that any bottlenecks at a particular stage may typically set back the entire development project's completion.

FIG. 1 is a flow diagram of an exemplary series of steps in the development of a typical digital circuit. A typical development cycle begins with the creation of a design specification (step 110), an outline of the design that describes abstractly the functionality, interface, and overall architecture of the digital circuit. At this stage, the precise details of the implementation are not yet considered. Next, a behavioral description (step 120) may be created to aid in analyzing functionality, performance, compliance with standards, and other high level design issues. Such a behavioral description may be created in Verilog or VHDL, or may be implemented in a more specialized language such as SystemC, an open-source kernel that extends the C++ language, and enables hardware design. Such a behavioral description is then typically converted, to a Register-Transfer Language (RTL) description (step 130) in which a circuit is characterized by the values in registers at particular clock cycles. In an RTL description, a digital circuit may be abstracted to a series of interconnected finite state machines (FSMs) that encompass the circuit's functionality. Such an RTL description may be created in Verilog or VHDL, or another suitable language.

Next, functional verification (step 140) is typically performed on the RTL description. Functional verification is a key step in the development processes, where desired functionality is checked and most functional bugs are located and corrected through modification of the RTL code (see prior step 130). During functional verification, a combination of direct and random tests are typically employed on a simulation of the digital circuit. Such a simulation generally loads HDL code and simulates its behavior in a software environment adapted for testing and analysis. As digital circuit designs become increasingly complicated, the computations necessary for simulation have become a problematic and time-consuming issue in the verification process.

After functional verification, logic synthesis tools are typically employed (step 150) to convert the RTL description (of step 130) to a gate-level netlist (step 160), which is a description of the circuit in terms of gates and connections between them. Logic synthesis tools (from step 150) generally attempt to produce a gate-level netlist that meets timing, area, power and other specifications of the design specification. Such specification factors may be checked through logical verification (step 170). Results generated in logical verification may be compared with results obtained during functional verification (see step 140) to ensure correctness of operation. Again, if errors are found, RTL description (from step 130) may be altered and the sequence repeated. After successful logical verification (see step 170), a physical layout of the digital circuit showing the position of gates and connecting traces is typically created (step 180)

with a Place and Route tool. Such a layout is typically subject to layout verification (step 190) and, if any issues are detected, the physical layout (from step 180) may be appropriately modified. Once this verification is complete, the device may be fabricated onto a chip to produce a finished hardware device in step 195.

As noted above, the functional verification and simulation stage is a key stage in the hardware development process. In more detail, functional verification typically begins with the creation of a functional test plan, a fundamental framework for the testing of the digital circuit. Based on this test plan, various routines adapted to test specific functionality of the circuit are developed. These test routines are designed to be applied to a simulation of the digital circuit, often referred to as the design-under-test (DUT). Commonly, a High-Level Verification Language (HVL), such as VERA developed by Synopsys, Inc., is employed to aid in writing test routines and in creating a test environment around the DUT that facilitates testing. HVLs typically combine object-oriented programming approaches with parallelism and timing constructs and thus are well suited for verification. HVLs may be further employed to create input drivers, output drivers, data checkers, protocol checkers, coverage analysis testers, and other devices useful in the verification process.

The test environment interacts though an interface with the simulation of the DUT. Generally, simulators are classified into three basic types, based upon the manner in which they perform simulation. Interpretive simulators, such as Verilog-X, available from Cadence Design Systems Inc, operate by reading in an HDL design, creating data structures in memory, and running a simulation interpretively. Interpretive simulators are characterized by their compiling of HDL code each and every time the simulation is run.

Compiled-code simulators, such as VCS available from Synopsys, Inc, operate by reading in an HDL design and converting it to a programming language, such as C. This code is then compiled by a standard compiler to produce a binary executable that may be executed to run the simulation. Compile time may be lengthy for compiled code simulators, but in general, execution speed is faster than possible with interpretive simulators.

Finally, native-compiled-code simulators, such as Verilog-NC available from Cadence Design Systems Inc., operate by reading in an HDL design and converting it directly to binary code for a specific machine platform. Compilation is optimized specifically for this platform, making the simulation machine specific. Due to the machine specific optimizations, native-compiled-code simulators can yield significant performance benefits compared to other types of simulators.

Regardless of their type, HDL simulators employ a simulation strategy to simulate design elements. The simplest simulation strategy is termed "oblivious," or alternately "exhaustive," simulation. In oblivious simulation, the simulator processes and updates state values of all elements (modules) in the design, irrespective of changes in signals. That is, the state value of each module is updated every time step (clock cycle), regardless of whether there is activity, or a change in the state of the system that affects the particular module. Computing all state values for all clock cycles is typically redundant and generally consumes unnecessary computing resources. Indeed, an oblivious simulator may perform quite inefficiently when a module is inactive, i.e. does not change state, for many clock cycles.

In an attempt to address this inefficiency, various schemes have been developed for reducing the amount of computation necessary for simulation, including schemes for reordering, rewriting, queuing, deferring, or otherwise systematically evaluating a subset of the system's state values. One of the most prevalent approaches to reducing computation is termed "event-driven" simulation. Event-driven simulation is characterized by the computation of state values for modules only when signals at the inputs of these modules change (herein termed an "event"). Accordingly, FIG. 2 depicts a generalized block diagram of an event-driven simulator 200 for the simulation of an HDL design according to a prior art implementation. In an event-driven simulator, a series of modules 230, 232 and 234 are generally interconnected to, and intercommunicate with, a simulation core 210 that manages the simulation process. A first software module 230 is executed in response to an initial event to begin the simulation cycle. This module, in turn, generates further events which are delivered to the simulation core 210 for transfer to other modules 232, 234. The simulation core 210 typically maintains an event-response table 220 to determine where events from a given module are to be transferred. For example, as illustrated in FIG. 2, a first event, event(1), may cause a module 230 to generate a second event, event(2), which is routed by the simulation core 210 to two additional modules 232 and 234. Such a process of events-causing-further-events may continue for many levels in complex designs.

When an event is delivered to a module 230, 232 and 234, a child process, 240, 242 and 244 is called to execute the code in the module. A current state 250, 252 and 254 for the module 230, 232, 234 is also formed, representing an event triggered by the child process 240, 242, 244 and the current state of any global variables used as inputs to the module. The child processes 240, 242, 244 typically execute under the control of an operating system until execution is completed. Typically, an event-driven simulator operates within a multi-threading operating system, with each child process 240, 242, 244 representing a separate thread of execution, all of which threads execute contemporaneously within the processor's runtime operation.

While event-driven simulation offers significant improvements over oblivious simulation, the approach still contains notable inefficiencies. In event-driven simulation, when an event is processed, all dependant data is updated, through the triggering of additional events, to determine a new global state of the system. Values for data that will not control the next state transition of the system, and values for data which is transient, i.e. that will not be stored due to subsequent logic control, are still updated, and cause events to be triggered, even though these values are not used. For example, consider the effects of event-driven simulation on a hypothetical digital circuit design which include the following HDL pseudo code:

```
reg [3:0] q;
reg [3:0] e;
wire [3:0] y=q+5;
always @(posedge clock) begin
q<=z+2;
end
always @((posedge clock) begin
if (controlsignal) begin
   e<=y;
end
else
begin
   e<=5;
end
end
```

In the above hypothetical example, the value of y depends on the value of q, which in turn depends on the value of z. Hence, in an event-driven simulator, a change in the value of z would trigger events causing the value of y and q to be updated by child processes. Yet the values of y and q are only needed when they control the next state transition, in this example, only when the Boolean value controlsignal is logical true. Thus when controlsignal is logical false, needless computation is performed by an event-driven simulator to update values of y and q that are never used.

Again, as digital circuit designs become increasingly complex, simulation emerges as a primary computational bottleneck in the overall hardware development process, consuming unacceptable processing time. The inefficiencies associated with computing redundant or transient values in an oblivious or an event-driven simulator merely compound the already-computationally intensive stage of simulation. It would be desirable for such an HDL simulator to function in a manner that would eliminate computation of unnecessary values that do not affect the current state of the system. An improved simulator should address this inefficiency, while not requiring an inordinate amount of computation in other areas, so that an overall performance gain may be realized.

SUMMARY OF THE INVENTION

Briefly, the present invention provides a system and method for simulating a digital circuit that uses scheduling information from Term Rewriting System (TRS) rules to limit the computation of simulation values to only those values used by the rules scheduled to execute on the current state of the system. In a TRS based digital circuit design, typically only a small subset of TRS rules are scheduled to execute on any given state. This novel system and method for simulation uses scheduling information for these rules to determine which values are needed for the executing subset of TRS rules, and only computes these relevant values. Since, for TRS rules, the logic for computing rule activation, i.e. the predicates, is separate from the logic for executing the actions, i.e. the action bodies, the simulator need only consider a limited amount of additional information to determine which rules are executed on a given cycle. Broadly stated, the system and method of this invention employs a top-down approach to device simulation (as opposed to the bottom-up approach typically employed by prior simulators), looking first to which rules are to be executed, and only then, to the values needed by those rules.

The new simulation system and method may be used to create a standalone simulation of a synchronous digital circuit from an asynchronous circuit specification. A TRS compiler creates executable code which models the circuit's functions. This executable code may be linked by a code simulator with a runtime executable, which provides input interfaces, output interfaces, data-checking and testing tools. The executable code may further be linked to a runtime library of primitive objects, i.e. gates and other logic devices, which provide requisite timing characteristics for the simulation.

The inventive system and method avoids inefficiencies associated with traditional techniques, such as event-driven simulation, by avoiding computation of redundant or transient values for data that will not control the next state transition of the system. Further, due to the inherent structure of TRS rules, the advantages of the new simulator may be achieved with minimal additional computations so as to determine which rules will execute.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
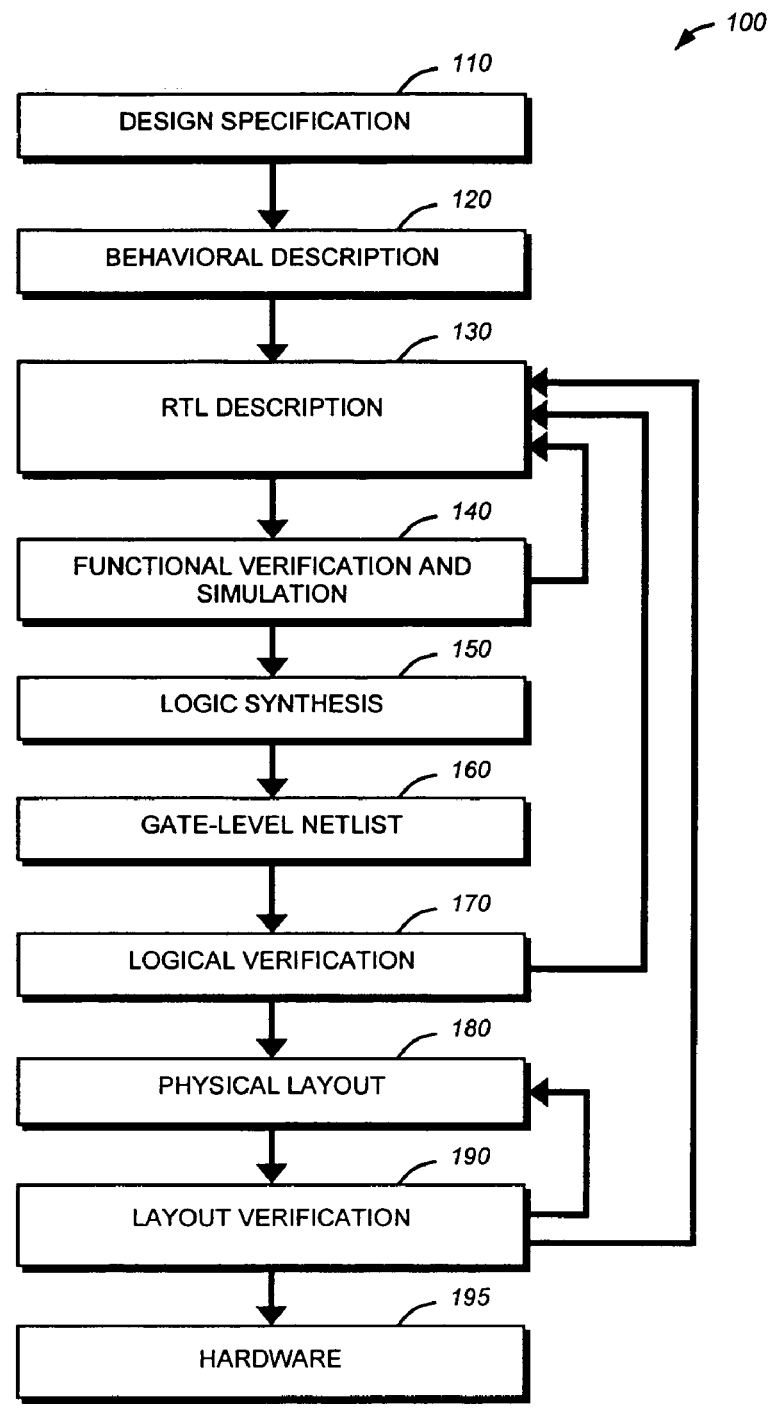
FIG. 1, already described, is a flow diagram of an exemplary series of steps in the development of a typical digital circuit according to a prior art implementation.
Figure 2:
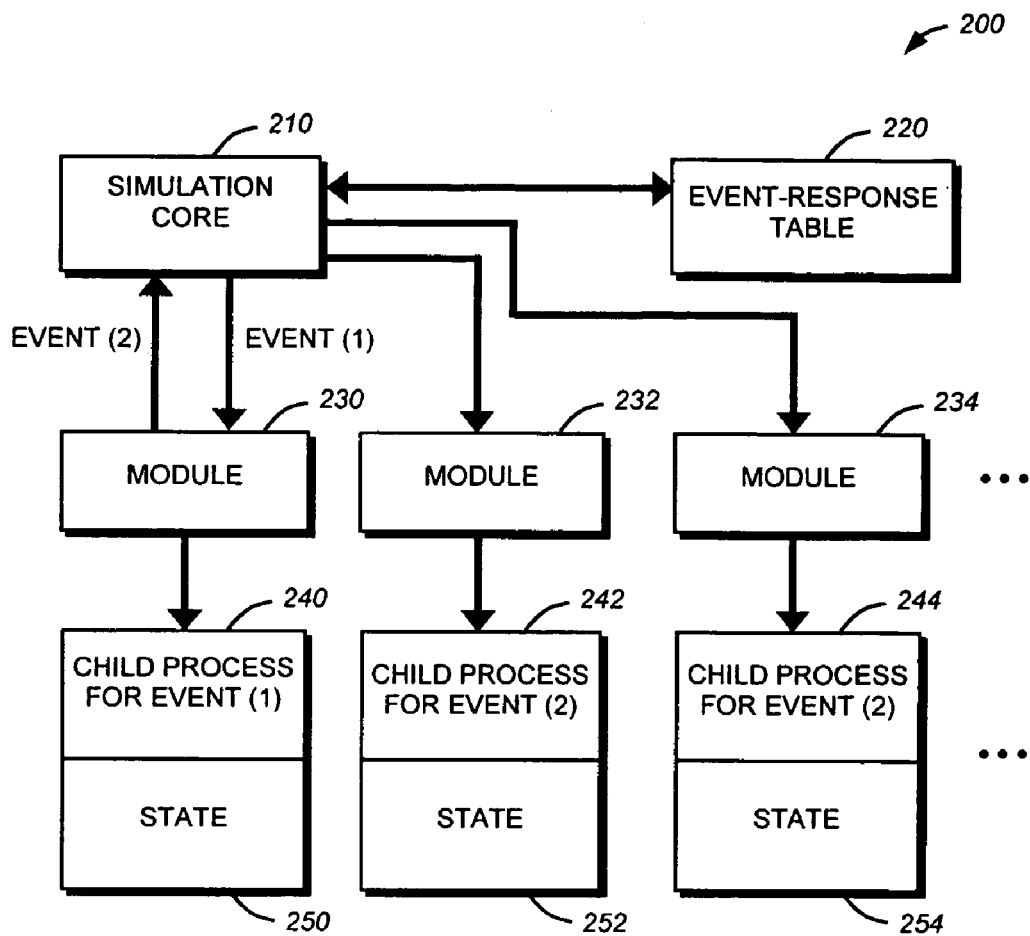
FIG. 2, already described, is a generalized block diagram of an event-driven simulator for the simulation of an HDL design according to a prior art implementation.
Figure 3:
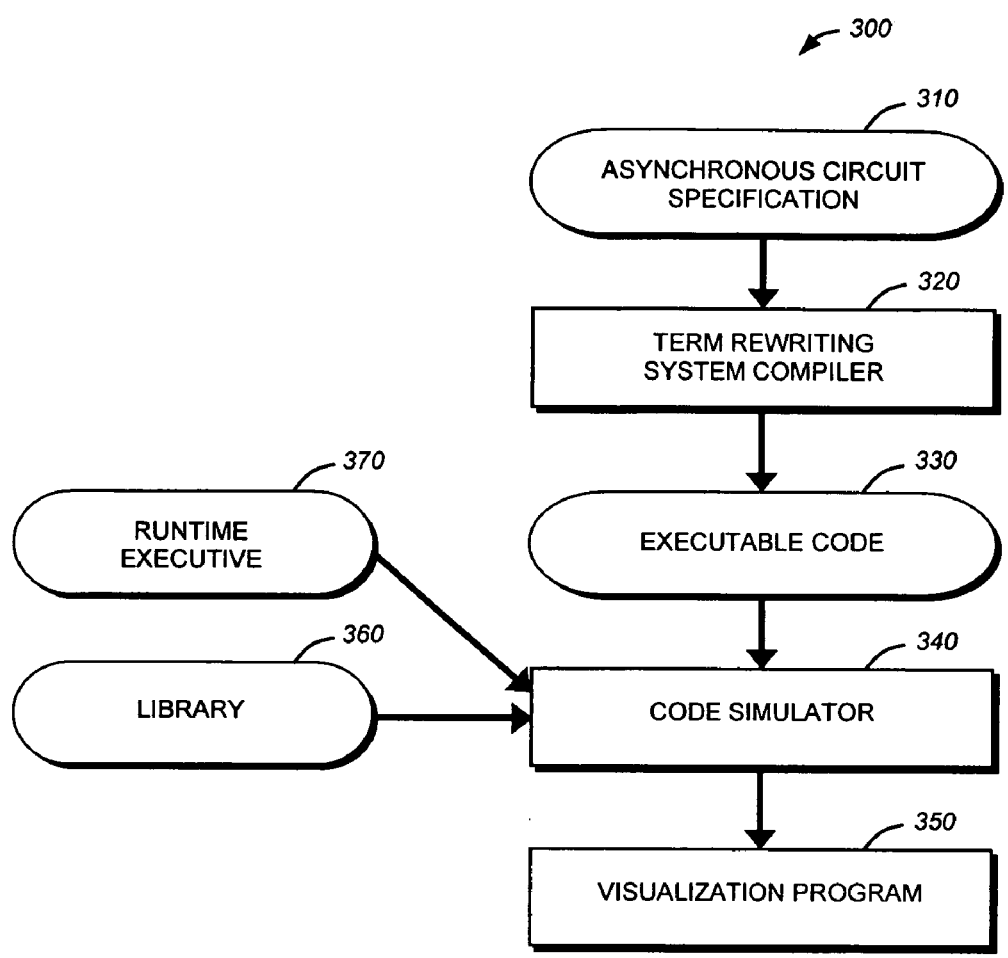
FIG. 3 is a flow diagram of a circuit simulation system that accepts an asynchronous circuit specification and produces executable code that models a synchronous digital circuit.

FIG. 3 depicts a circuit simulation process or system 300, according to an illustrative embodiment of this invention, which accepts an asynchronous circuit specification 310 and produces executable code 330 that models a synchronous digital circuit. The circuit simulation system 300 includes a Term Rewriting System Compiler (TRSC) 320 that interprets the asynchronous circuit specification 310 and performs a series of operations described further below. Executable code 330 may thereafter be executed by a code simulator 340 that combines the code with a runtime executive 370 that includes input interfaces, output interfaces, data checking and testing tools suited for verification of a simulation a synchronous digital circuit. Further, executable code 330 may be combined with a library 360 of primitive objects that contains signal timing information useful for simulation. Typical primitive objects include a variety common logic gates, such as, and or gates, and operators such as add and subtract. A visualization program 350 may thereafter provide a user interface to a designer or other type of user.

Both TRSC 320 and code simulator 340 are software applications that, when executed on a computer, implement the circuit simulation approaches described below. In one embodiment of the circuit simulation system 300, the executable (computer-readable) programming code 330 may take the form of C code. It should be noted, however, that the executable code 330 may alternately be implemented in another programming language, such as, for example, the Java programming language first developed by James Gosling of Sun Microsystems.

Considering this system in more detail, asynchronous circuit specification 310 may be specified according to a Term Rewriting System (TRS). A Term Rewriting System generally employs rules that have a predicate and an action body, and may be written in the general form:

$$\pi(s) \Rightarrow s := \delta(s)$$

where π is the predicate and s:=δ(s) is the action body. Function δ is used to compute the next state of the system from the current state s. The system functions by selecting a rule whose predicate is true, and then atomically (without interaction with other rules) executing the rule's action body. The selecting and executing of rules continues as long as some rule's predicate is true.

Such a system is suited for design and verification of complex digital systems as explained in Arvind and X. Shen, "Using Term Rewriting Systems to Design and Verify Processors," MIT LCS Memo CSG-419, *IEEE Micro*, May/June 1999; Mithal et al., Digital Circuit Synthesis System, U.S. Pat. No. 6,597,664; and Mithal et al., Digital Circuit Synthesis System, U.S. patent application Ser. No. 10/264,962, all of which are incorporated by reference herein in their entirety.

In an illustrative embodiment, the asynchronous circuit specification 310 may be specified in Bluespec™ System Verilog (BSV) which implements Term Rewriting System semantics in combination with other high level programming constructs as described in the Bluespec™ System Verilog Version 3.8 Reference Guide, incorporated herein by reference. It is expressly contemplated, however, that other suitable languages implementing a general form or function of a Term Rewriting System may be employed with the approaches described herein. If asynchronous circuit specification 310 is a BSV specification, TRSC 320 may be a Bluespec™ Compiler (BSC) or another suitable compiler adapted to implement the scheduling and circuit synthesis approaches described herein. Further, the code simulator 340 may be a Bluespec™ C simulator or other suitable simulator adapted to implement the approaches described herein.

To illustrate an example of TRS rules in hardware design, let asynchronous circuit specification 310 characterize a circuit for computing the greatest common devisor (GCD) of two numbers using Euclid's algorithm. This example is chosen merely to illustrate a possible use of Term Rewriting System rules, and in no way limits the type of circuit that can be characterized by, or the syntax used in, asynchronous circuit specification 310. In the chosen example, the exemplary asynchronous circuit specification 310 may read in part:

```
module mkGCD (ArithIO# (int));
  Reg# (int) x( );
  mkReg#(0) the_x (x);
  Reg#(int) y( );
  mkReg#(0) the_y (y);
  rule flip (x>y&&y!=0);
    x<=y;
    y<=x;
  endrule
  rule sub (x<=y && y !=0);
    y<=y-x;
  endrule
  method Action input (int ix, int iy) if (y==0);
    action
    x<=ix;
    y<=iy;
    endaction
  endmethod: input
  method int output( ) if (y==0);
    return x;
  endmethod: output
endmodule: mkGCD
```

Referring to the exemplary code above, the module defines two registers, registers x and y. Further the module defines two rules, flip and sub, that implement Euclid's algorithm on registers x and y. Each rule contains a predicate and an action body. For example in rule flip, the expression, x<=y&&x!=0 forms the predicate and the register write statements, x<=y;

y<=x;

form the action body.

If a predicate is omitted, the rule is assumed to always apply, and if the action body is omitted the rule has no effect. Assuming the registers x and y have been initialized with input values, the rules will repeatedly update the registers with transformed values, terminating when the register y contains zero. At that point, the rules cease executing, and the GCD result is placed in register x. Note that, in this basic example, the two rules flip and sub are never applicable at the same time. In more complicated examples, predicates for multiple rules may be true for a given state. For example, the expression "x>y" may be replaced with "x>=y" in the predicate of rule flip. In this new example, more than one rule could apply in each cycle and a determination would have to be made as to whether the rules conflict. Thus, the system would have to determine whether to execute rule flip, rule sub, or both rules on the same state.

Figure 4:
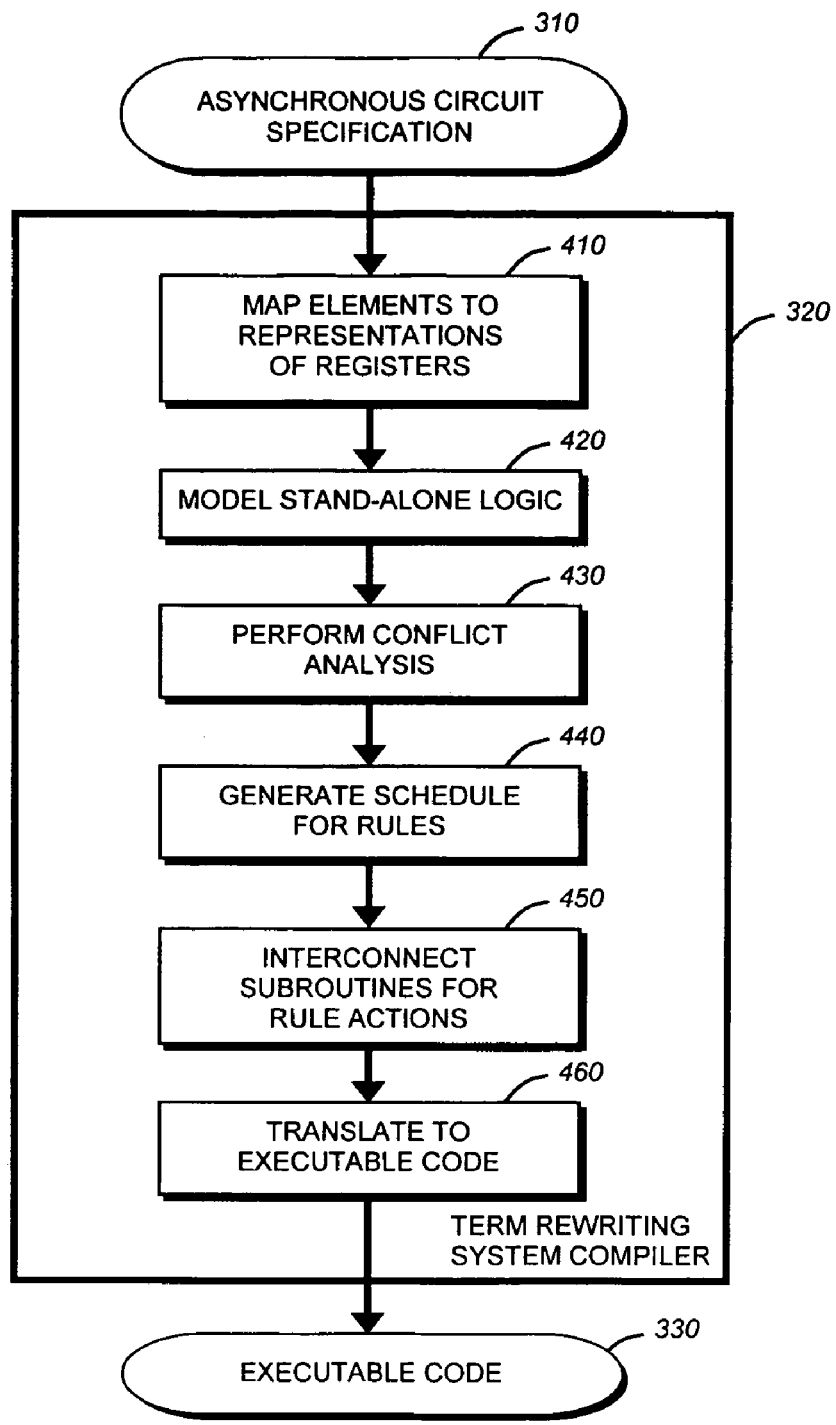
FIG. 4 is a flow diagram of a Term Rewriting System Compiler used with the circuit simulation system to convert an asynchronous circuit specification to executable code that models a synchronous digital circuit.

FIG. 4 is flow diagram of a Term Rewriting System Compiler used with the inventive circuit synthesis system to covert an asynchronous circuit specification to a simulation of a synchronous circuit specification. Note that the steps in FIG. 4 are not necessarily performed in the sequence illustrated in the figure, and some steps may be performed in parallel. Therefore, any such reordering of these steps should be considered within the scope of this embodiment. At step 410, the TRSC 320 maps any storage elements specified in asynchronous circuit specification 310 into representations of registers or other predefined circuit elements for use with the simulation of the synchronous circuit. Next, in step 420, the TRSC 220 models enabling logic from the predicate, and updating logic from the action body of each rule. These models may take the form of subroutines, with one or more subroutine controlling rule activation, and other subroutines performing computations for carrying out the actions in the action bodies. Note that the subroutines are disconnected at this stage, and do not yet form an overall simulation of a synchronous digital circuit. At step 430, the TRSC 320 analyzes rule conflicts. That is, the TRSC identifies which rules are applicable in the current state, and identifies any conditions that would prevent concurrent execution of these rules. Next, at step 440, the TRSC generates a schedule that triggers a particular set of applicable rules to execute on a given system state. Then, in step 450, the TRSC 320 interconnects the subroutines for carrying out the actions of rules according to the schedule. This representation is then translated at step 460 into executable code 330 that is functionally equivalent to a synchronous digital circuit. Optimization operations may also be performed to refine the executable code 330, and streamline its execution.

Considering in more detail some of the steps described above, in step 410 the TRSC 320 maps storage elements in the asynchronous circuit specification 310 into a variety of representations of actual circuit elements whose values determine the state of the system. Asynchronous circuit specification 310 may include data-type declarations for a variety of types of storage elements. If scalar storage elements are used, the mapping by the TSRC 420 may be direct into a representation of a register circuit. If abstract storage elements are used, such as a register files or FIFO queues, the TRSC 420 may map these elements into representations of predefined circuit elements, for example, from a runtime library.

In step 420, the TRSC 320 models logic for the predicate and the action body of each Term Rewriting System rule. Formally, for a rule i, TRSC 320 considers expressions, $\pi_i(s)$ and $\delta_i(s)$ where the term s represents the state of the system, i.e., the values in all the storage elements.

In step 430, the TRSC 320 determines which rules may conflict if they execute concurrently and which rules are free from conflicts. Conflict-free rules are rules that can execute simultaneously without incident, that is, they do not update the same state nor update the state accessed (read) by the other rules. Such conflicts may be thought of as two devices attempting to access the same hardware resource, such as, for example, a single memory port, whereby only one device may have access at a time.

The conflict-free condition between two rules may be stated formally as follows. Consider two rules, rule i and rule j, with predicates $\pi_i$ and $\pi_j$ and next states defined by functions $\delta_i$ and $\delta_j$. Further, let s be the state of the system. If $\pi_i(s)$ and $\pi_j(s)$ are both true for some state s, then both $\pi_i(\delta_j(s))$ and $\pi_j(\delta_i(s))$ must also be true so that both rules remain enabled after the state transition enabled by the other rule. Furthermore, the effect of the updates must not depend on the order of the updates, that is, $\delta_i(\delta_j(s))$ must equal $\delta_j(\delta_i(s))$.

A variety of algorithms and data structures may be employed to help determine which rules are free from conflicts. One such structure is the Binary Decision Diagram (BDD), a data structure commonly thought of as a rooted, directed, acyclic graph with vertices that represent variables and edges connecting the vertices that represent values of the variables. Thus, a path through a BDD represents a particular assignment of values to variables. Such a structure may be advantageously employed to determine that two rules may never execute on the same state and therefore may never be in conflict.

In step 440 the TRSC determines a schedule that indicates which rules should execute in a particular cycle of a model of a synchronous implementation. Such a determination may be performed by a scheduler that implements one of a several scheduling methods. One type of scheduler that may be employed is a priority encoder which asserts one executable rule in each clock cycle. This type of scheduler may also include round-robin functionality that ensures that if a rule remains applicable for a sufficient number of consecutive clock cycles then it will be selected for execution. Another type of scheduler that may be employed is an enumerated scheduler (also termed direct table encoder). In an enumerated scheduler, applicable rules are listed in an enumerated encoder table, a lookup table constructed to contain an explicit listing of the rules that can execute given a certain combination of applicable rules. Such a table is constructed so that the maximum number of non-conflicting rules execute on a given clock cycle. Preferably, a scheduler that implements a preference order in scheduling conflicting rules may be used. That is, a scheduler may be employed that is adapted to schedule more preferred applicable conflicting rules over less preferred applicable conflicting rules. In this manner, the most preferred rule of a conflicting set is scheduled to execute on a given state. Thus, where two or more rules conflict, and only one may be chosen to execute, the preference order is used to break the tie. Such preference order may be user inputted, or generated by the TRSC. As in other implementations, non-conflicting applicable rules are allowed to execute concurrently with the chosen conflicting rule.

A schedule for TRS rules may be incorporated into a new system and method for simulation that addresses the shortcomings and inefficiencies of prior simulation techniques. Accordingly, in an illustrative embodiment a top-down approach to simulation is employed, where the simulation system first considers which Term Rewriting System (TRS) are scheduled to execute on the current state of the simulation. Thereafter only the simulation values used by those rules are calculated. In a TRS-based digital circuit design, typically only a small subset of TRS rules are scheduled to execute on any given state. Thus, by limiting computation of simulation values to only those rules active on that present state, performance gains may be realized.

Figure 5:
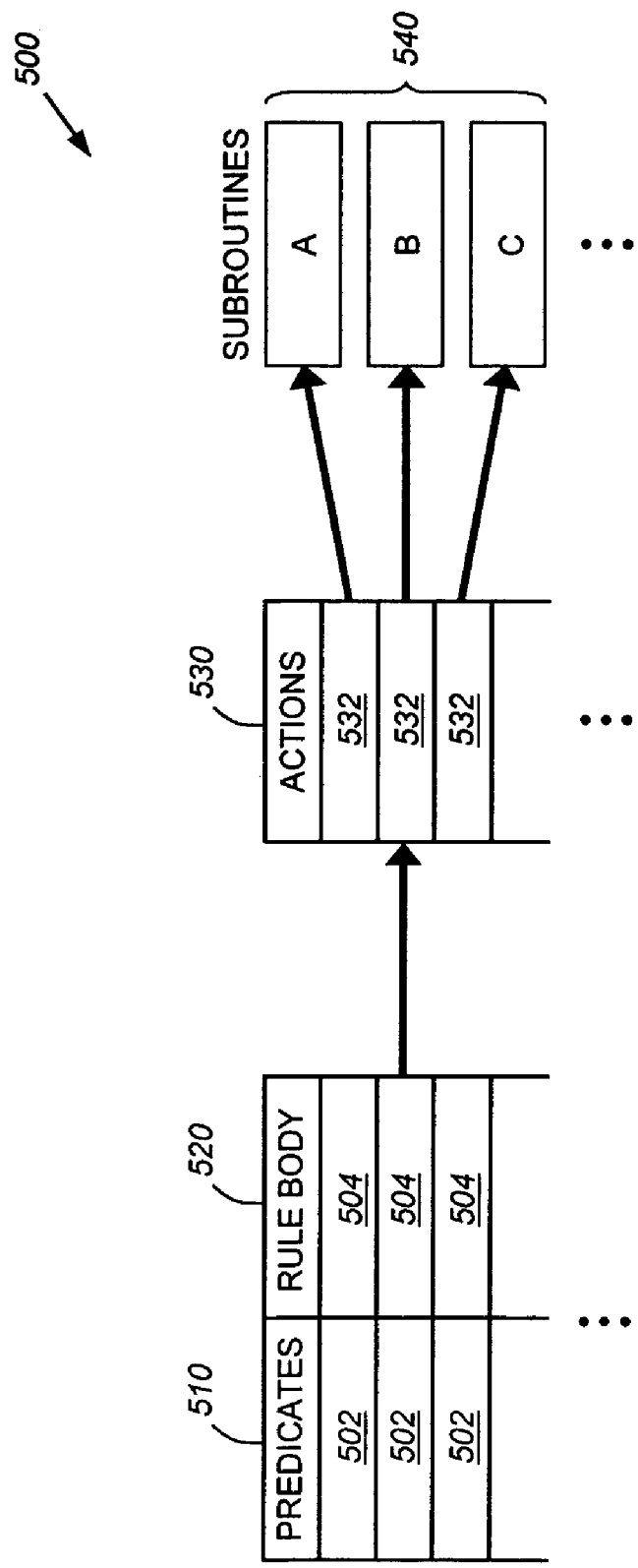
FIG. 5 is a generalized block diagram depicting the interaction of Term Rewriting System rules with software subroutines for simulation of a synchronous digital circuit.

FIG. 5 is a generalized block diagram depicting the interaction of Term Rewriting System rules with software subroutines for simulation of a synchronous digital circuit. The TRSC reads in a series of TRS rules 500, shown as a table of generic rule entries 502 and 504, each of which represents a pair that collectively defines a rule predicate 510 and a rule body 520. Predicate information is transmitted to the scheduler that determines which rules will execute on each cycle. The rule bodies are then abstracted to a list of actions 530 (entries 532), unconnected with any predicates. These actions may be characterized as a binary tree of values and operators that perform the functions described by the rule. The TRSC then takes each action and translates it into programming code. This programming code may take the form of a series of subroutines 540 (denoted A, B C, etc.), each of which performs the equivalent function as that specified by an action. That is, each subroutine may be an equivalent representation of a portion of the synchronous digital circuit being simulated. Subroutines are interconnected, such that if one subroutine requires a value computed by another subroutine, instances of the required subroutine will be created (instantiated) to compute this value. To simulate the synchronous digital circuit, the schedule produced from the rule predicates is combined with the subroutines, to create a simulation executable which executes selected subroutines each cycle of the simulation.

Operation of the simulation system and method may be illustrated by referring to a hypothetical example of an asynchronous circuit description including TRS rules. The reader is reminded that this hypothetical example is merely an illustration of one possible set of TRS rules the simulator may operate upon, and in no way limit the function, syntax, or other aspects of the TRS rules this invention is applicable to. A hypothetical example may read:

```
typedef UInt#(51) NumTyp;
interface ArithIO_IFC #(parameter type aTyp); // aTyp is a parameterized type
    method Action start(aTyp num1, aTyp num2);
    method aTyp result( );
endinterface: ArithIO_IFC
// The following is an attribute that tells the compiler to generate // separate code
```

-continued

```
for mkGCD
(* synthesize *)
module mkGCD(ArithIO_IFC#(NumTyp));    // here aTyp is defined to be type Int
    Reg#(NumTyp) x( );                 // x is the interface to the register
    mkReg#(?) the_x(x);                // the_x is the register instance
    Reg#(NumTyp) y( );
    mkReg#(0) the_y(y);
    rule flip (x > y && y != 0);
        x <= y;
        y <= x;
    endrule
    rule sub (x <= y && y != 0);
        y <= y - x;
    endrule
    method Action start(NumTyp num1, NumTyp num2) if (y == 0);
        action
            x <= num1;
            y <= num2;
        endaction
    endmethod: start
    method NumTyp result( ) if (y == 0);
        result = x;
    endmethod: result
endmodule: mkGCD
```

This hypothetical description performs the same function as the hypothetical code discussed above in reference to event-driven simulation. Yet, rather than compute values for y and q for each change in z, as would be done in event-driven simulation, the simulation system and method of this invention works backwards from the rule predicates to compute a minimal subset of values that are actually used to generate the next system state. That is, rather than assuming any change in the system may cause an indefinite number of dependant events, and therefore computing all values dependant on any value change, the new simulator can avoid computations that are not used. Thus if, for example, the scheduler determines that controlsignal is false in the above example, values for q and v need not be calculated. Similarly if the scheduler determines that rule e is in conflict with another rule, and this other rule has been selected to execute rather than rule e, then values for q and v again need not be calculated. Only when the scheduler determines controlsignal is true, and is the selected rule to execute if a conflict exists, are sub-routines called to generate values for q and v.

Such a simulation system and method is ensured of having worst-case performance no worse than prior event-driven methods, since the computations in worst-case scenarios would be equivalent. In most other cases, significant computational savings may be realized.

Figure 6:
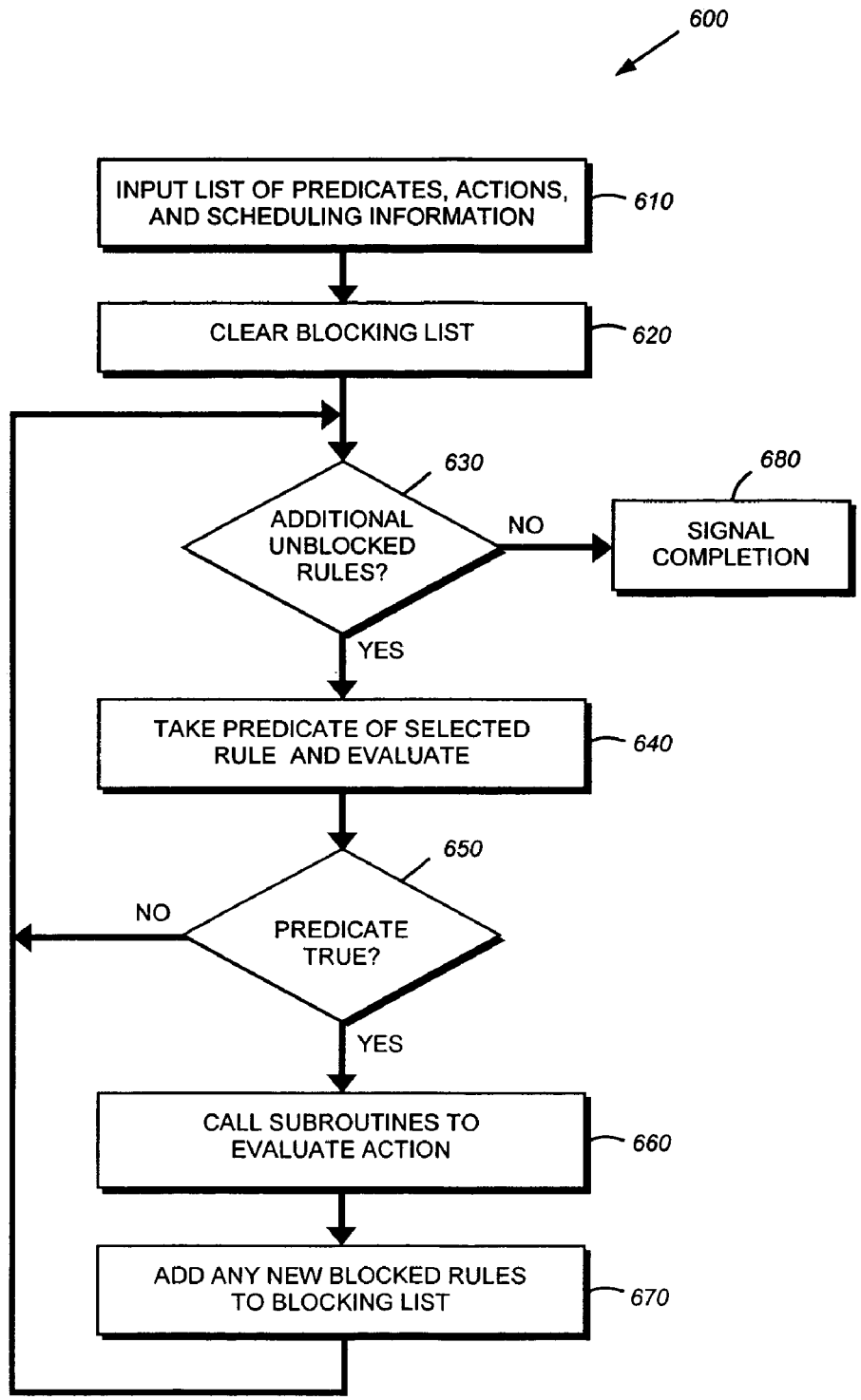
FIG. 6 is a flow diagram of the simulation of a synchronous digital circuit using Term Rewriting System rules to control execution of subroutines.

FIG. 6 is a flow diagram 600 of the simulation of a synchronous digital circuit using Term Rewriting System rules to control execution of subroutines. The flow diagram depicts operations that occur to simulate one clock cycle of the synchronous circuit. To simulate additional clock cycles, the sequence of steps may be repeated until the entire circuit is simulated. The sequence of steps (600) begins at step 610, when the simulator takes as an input a list of rule predicates, rule actions, and scheduling information. Next, at step 620, a blocking list is cleared by the simulator. The blocking list is a data structure that may operate in conjunction with the scheduler to indicate which rules are barred from execution on the current state of the simulation of the synchronous digital circuit. At step 630, a decision is made to determine if any unblocked rules exist. If not, the sequence terminates at step 680. If unblocked rules exist, the predicate of a selected unblocked ruled is evaluated at step 640. If the predicate is logical false, execution returns to decision step 630. If the predicate is logical true, execution proceeds to step 660, where a subroutine for performing the actions of the rule is called and executed. Finally, at step 670, the simulation system, in conjunction with the scheduler, adds any newly blocked rules, caused by conflicts with executed rules, to the blocking list. Thereafter, execution may loop back to step 630, and repeat.

Figure 7:
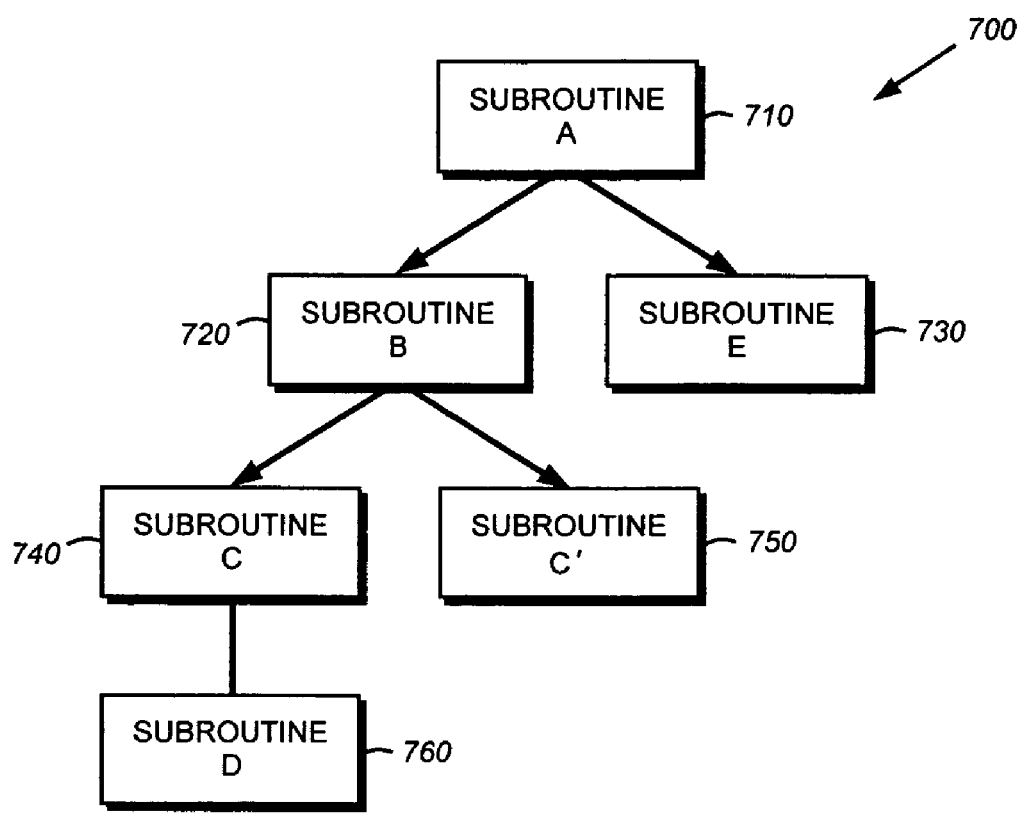
FIG. 7 is a block diagram illustrating a strategy for the order of simulation of exemplary subroutines of a synchronous digital circuit.

FIG. 7 is a block diagram 700 illustrating a depth first strategy for the order of execution of subroutines, that may be used with the above described simulation system and method. A depth-first execution strategy operates such that a chain of related sub-routines will be evaluated to its terminal level, before another chain of subroutines is evaluated.

Consider a hypothetical set of subroutines A, B, C, D, and E, which operate to simulate the functions of a hypothetical digital circuit. Note, this example is chosen merely to illustrate a strategy for computation of subroutines, and in no way limits the type of subroutines that may be used with this simulation system. Considering the case where subroutine A (710) requires values from subroutines B (720) and E (730), as denoted by the branch lines therebetween. Likewise, subroutine B (720) requires values from two instances of subroutine C, namely C (740) and C' (750), which in turn requires values from subroutine D (760). Depth-first execution would cause the subroutines to execute in the order: A, B, C, D, C', E, progressing to the bottom of the subroutine chain, before beginning the next path. Such a depth-first technique may complement the advantages of the simulation techniques discussed above, ensuring values are quickly returned to the highest level of simulation.

A further performance enhancing technique that may be used with the above described simulation system and method is the technique of lazy evaluation of rule predicates. Lazy evaluation may include several strategies, one of which is minimal evaluation. In minimal evaluation, an expression is only evaluated until the point where its final value may be determined. That is, execution of an expression is abbreviated when it is not necessary to evaluate all parts of the expression to determine the final result. For example, consider a hypothetical rule predicate (a && b). If the value of a is determined to be logical false, the value of b is not needed to determine that the entire expression evaluates to logical false. Therefore a simulator practicing lazy evaluation need not run a sub-routine to evaluate the value of b in some situations. Such a computation minimizing technique may be advantageously employed to further reduce computations in the above described simulation system and method.

The foregoing has been a detailed description of a several embodiments of the present invention. Further modifications and additions can be made without departing from the invention's intended spirit and scope. It is expressly contemplated that any or all of the processes and data structures described above can be implemented in hardware, software, or a combination thereof. A software implementation may comprise a computer-readable medium containing executable program instructions for execution on a computer. It should be remembered that the above descriptions are meant to be taken only by way of example, and not to otherwise limit the scope of this invention.

What is claimed is:

1. A method for simulating the operation of a digital circuit comprising:
    describing the digital circuit, at least partially, with one or more Term Rewriting System (TRS) rules, wherein each TRS rule includes a predicate and an action body;
    creating one or more subroutines, each subroutine corresponding to a TRS rule and adapted to perform functions equivalent to functions of the action body of the TRS rule, each subroutine corresponding to one or more simulation values;
    scheduling one or more TRS rules to execute on a given clock cycle of the simulation; and
    computing, in response to the scheduling, the one or more simulation values corresponding to a subroutine corresponding to a TRS rule scheduled to execute,
    wherein the simulation values are not computed where the predicate of the corresponding TRS rule is not true; and
    selecting a first TRS rule to execute that is in conflict with a second TRS rule on a given clock cycle;
    preventing the second TRS rule from executing on the given clock cycle.

2. The method of claim 1 wherein the scheduling of the one or more TRS rules is, at least partially, in response to the predicates of the one or more TRS rules.

3. The method of claim 1 wherein the step of scheduling further comprises:
    selecting TRS rules according to a preference order.

4. The method of claim 1 wherein the step of preventing further comprises the step of:
    adding the second TRS rule to a blocking list.

5. The method of claim 1 wherein the one or more subroutines are part of an executable code simulation of the digital circuit.

6. The method of claim 5 wherein the executable code simulation is a C code simulation.

7. A digital circuit simulation system comprising:
    one or more Term Rewriting System (TRS) rules for describing the digital circuit, each TRS rule including a predicate and an action body;
    one or more subroutines, each subroutine corresponding to a TRS rule and adapted to perform functions equivalent to functions of the action body of the TRS rule, each subroutine corresponding to one or more simulation values;
    a scheduler adapted to schedule one or more TRS rules to execute on a given clock cycle of the simulation; and
    wherein, in response to the scheduler, the one or more simulation values corresponding to a subroutine corresponding to a TRS rule scheduled to execute are computed, and simulation values are not computed where the predicate of the corresponding TRS rule is not true; and
    selecting a first TRS rule to execute that is in conflict with a second TRS rule on a given clock cycle;
    preventing the second TRS rule from executing on the given clock cycle.

8. The digital circuit simulation system of claim 7 wherein scheduling of the one or more TRS rules is, at least partially, in response to the predicates of the one or more TRS rules.

9. The digital circuit simulation system of claim 7 further comprising:
    a preference order for the selection of TRS rules.

10. The digital circuit simulation system of claim 7 further comprising:
    a blocking list adapted to store TRS rules that not selected to execute on a given cycle of the simulation.

11. The digital circuit simulation system of claim 7 wherein the one or more subroutines are part of an executable code simulation of the digital circuit.

12. The digital circuit simulation system of claim 7 wherein the executable code simulation is a C code simulation.

13. A computer readable medium containing executable program instructions for simulating a digital circuit, the executable program instructions comprising program instructions for:
    describing the digital circuit, at least partially, with one or more Term Rewriting System (TRS) rules, each TRS rule including a predicate and an action body;
    creating one or more subroutines, each subroutine corresponding to a TRS rule and adapted to perform functions equivalent to functions of the action body of the TRS rule, each subroutine corresponding to one or more simulation values;
    scheduling one or more TRS rules to execute on a given clock cycle of the simulation;
    computing, in response to the scheduling, the one or more simulation values related to a subroutines corresponding to a TRS rule scheduled to execute; and
    preventing computation of simulation values that are not corresponding to the subroutines corresponding to the one or more TRS rules scheduled to execute; and
    selecting a first TRS rule to execute that is in conflict with a second TRS rule on a given clock cycle;
    preventing the second TRS rule from executing on the given clock cycle.

* * * * *